(12) United States Patent
Bodenweber et al.

(10) Patent No.: US 10,088,244 B2
(45) Date of Patent: Oct. 2, 2018

(54) ADJUSTABLE HEAT SINK FIN SPACING

(71) Applicant: International Business Machines Corporation, Armonk, NY (US)

(72) Inventors: Paul F. Bodenweber, Kingston, NY (US); Kamal K. Sikka, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/800,095

(22) Filed: Nov. 1, 2017

(65) Prior Publication Data

US 2018/0051940 A1 Feb. 22, 2018

Related U.S. Application Data

(60) Continuation of application No. 15/499,417, filed on Apr. 27, 2017, now Pat. No. 9,921,008, which is a
(Continued)

(51) Int. Cl.
*H01L 23/00* (2006.01)
*F28F 3/08* (2006.01)
(Continued)

(52) U.S. Cl.
CPC .......... *F28F 3/083* (2013.01); *H01L 21/4882* (2013.01); *H01L 23/3672* (2013.01);
(Continued)

(58) Field of Classification Search
CPC ......... H01L 23/4006; H01L 2023/4062; H01L 2023/405; H01L 2023/4087;
(Continued)

(56) References Cited

U.S. PATENT DOCUMENTS 4,534,335 A    8/1985  Rice
5,051,656 A *  9/1991  Rajan ...................... H01J 23/00
                                                         29/600
(Continued)

OTHER PUBLICATIONS

T. Y. Kim et al., "Scroll heat sink: A heat sink with the moving fins inserted between the cooling fins," 11th Intersociety Conference on Thermal and Thermomechanical Phenomena in Electronic Systems, ITHERM, 2008. pp. 489-496.
(Continued)

*Primary Examiner* — Ngan Ngo
(74) *Attorney, Agent, or Firm* — ZIP Group PLLC

(57) ABSTRACT

A heat sink includes a heat sink base/riser, a first fin, and a second fin. The spacing between the base/riser and the first fin and the second fin, restively, may be adjusted by rotating a threaded rod. The threaded rod includes a first threaded knurl that is engaged with the first fin and a second threaded knurl that is engaged with the second fin. The thread pitch of the first threaded knurl and the second threaded knurl may differ. For example, the pitch of the first threaded knurl may be smaller than the pitch of the second threaded knurl if the first fin is located nearest the heat sink base/riser relative to the second fin. The spacing of the heat sink fins may be adjusted based upon the current operating conditions of the electronic device to maintain an optimal temperature of a heat generating device during device operation.

20 Claims, 10 Drawing Sheets

US 10,088,244 B2
Page 2

Related U.S. Application Data division of application No. 15/131,134, filed on Apr. 18, 2016, now Pat. No. 9,735,083.

(51) Int. Cl.
| | |
|---|---|
| *H05K 7/20* | (2006.01) |
| *H01L 21/48* | (2006.01) |
| *H01L 23/367* | (2006.01) |
| *F28F 3/06* | (2006.01) |
| *H01L 23/40* | (2006.01) |

(52) U.S. Cl.
CPC ..... *H01L 23/4006* (2013.01); *H05K 7/20418* (2013.01); *F28F 3/06* (2013.01); *F28F 2215/14* (2013.01); *F28F 2240/00* (2013.01); *H01L 2023/405* (2013.01); *H01L 2023/4056* (2013.01); *H01L 2023/4062* (2013.01); *H01L 2023/4087* (2013.01)

(58) Field of Classification Search
CPC ......... H01L 2023/4056; H01L 21/4882; H01L 23/3672; F28F 3/083
See application file for complete search history.

(56) References Cited

U.S. PATENT DOCUMENTS

| | | | |
|---|---|---|---|
| 5,210,424 A * | 5/1993 | Gelzer | H01J 37/20 250/443.1 |
| 5,726,495 A | 3/1998 | Aihara et al. | |
| 5,784,257 A | 7/1998 | Tata | |
| 6,712,128 B1 | 3/2004 | Dussinger | |
| 7,161,804 B2 | 1/2007 | Oyamada | |
| 7,203,065 B1 | 4/2007 | Sin Yan Too | |
| 7,375,963 B2 * | 5/2008 | Eckberg | H01L 23/4006 165/185 |
| 8,693,200 B2 | 4/2014 | Colgan et al. | |
| 2007/0097648 A1 | 5/2007 | Xu et al. | |
| 2007/0227707 A1 | 10/2007 | Machiroutu et al. | |
| 2008/0134506 A1 | 6/2008 | Cushen | |
| 2010/0200984 A1 * | 8/2010 | Storch | H05K 1/0204 257/720 |
| 2011/0315737 A1 | 12/2011 | Hamilton | |
| 2013/0138262 A1 | 5/2013 | Busch | |
| 2013/0153187 A1 | 6/2013 | Durham | |
| 2013/0327505 A1 | 12/2013 | Gonzalez | |
| 2013/0340989 A1 | 12/2013 | Megarity | |
| 2015/0289359 A1 | 10/2015 | Schmidt | |
| 2017/0231113 A1 * | 8/2017 | Anderl | G06F 1/20 |

OTHER PUBLICATIONS

C. Rubio-Jimenez et al., "Numerical analysis of novel micro pin fin heat sink with variable fin density," IEEE Transactions on Components, Packaging and Manufacturing Technology, vol. 2, No. 5, 2012, pp. 825-833.

Simons, "Estimating Natural Convection Heat Transfer for Arrays of Vertical Parallel Plat Plates," Electronics Cooling Magazine, available at: http://www.electronics-cooling.com/2002/02/estimating-natural-convection-heat-transfer-for-arrays-of-vertical-parallel-flat-plates/, Feb. 1, 2002.

List of IBM Patents or Patent Applications Treated As Related, dated herewith.

* cited by examiner

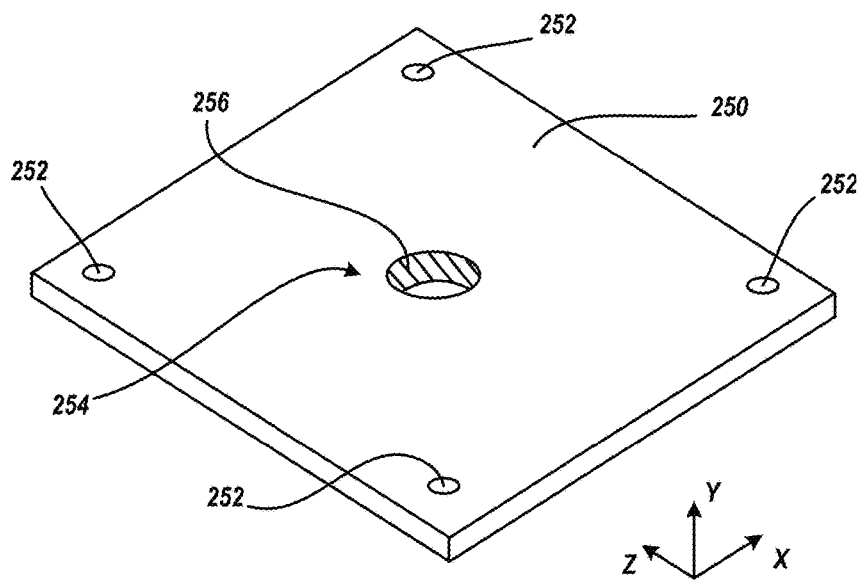
FIG. 4
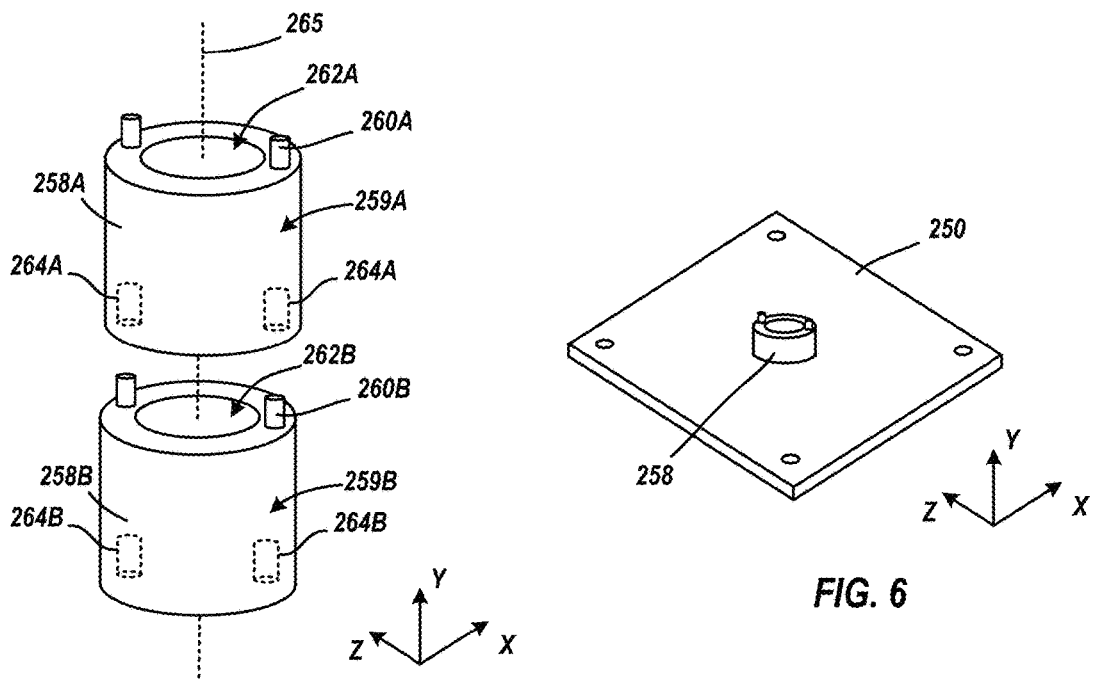
FIG. 5
FIG. 6

ADJUSTABLE HEAT SINK FIN SPACING

FIELD OF THE EMBODIMENTS

Embodiments of the present invention generally relate to electronic devices and more specifically to removal of heat from the electronic device via a heat sink that includes heat sink fins separated from a heat sink base or heat sink riser by an adjustable spacing.

DESCRIPTION OF THE RELATED ART

An electronic package may include an integrated circuit (IC) chip, semiconductor die, processor, and the like, herein referred to as a heat generating device, packaged onto a carrier or substrate. The heat generating device may be encapsulated by a cover having high thermal conductivity. A heat sink may be thermally connected to the cover to cool the heat generating device during operation of the electronic device where electrical energy is used by the heat generating device which results in the heating of the heat generating device. In some instances, there is no cover and the heat sink is attached directly to the heat generating device. The heat sink generally removes heat from the heat generating device causing the heat generating device to operate at a lower temperature.

A typical heat sink includes a metallic base and a plurality of metallic fins connected to an upper side of the base. The lower side of the base is thermally connected to the cover or directly to the heat generating device. The fins increase the surface area of the heat sink and are generally spaced apart from one another. The spacing creates a passage for the cooling fluid, such as air, to flow across the fins. Heat is transferred from the heat generating device, to the cover, to the heat sink base, to the plurality of fins, and to the cooling fluid flowing across the fins.

It is known that an optimal spacing between fins may be determined. However, known solutions generally determine optimal fin spacing during electronic system or heat sink design based upon predicted operating conditions such as predicted heat density (power per unit area), predicted cooling capacity (air flow rate, etc.), or the like. Once the optimal fin spacing is determined, the heat sink is fabricated such that the fins are fixed to the base with the prescribed spacing. Since these operating conditions vary during operation of the electronic device and from device to device due to manufacturing variability, the initially optimized fin spacing may no longer remain optimal and the heat sink does not most efficiently cool the heat generating device.

SUMMARY

In an embodiment of the present invention, a method to fabricate an electronic device is claimed. The method includes engaging a first heat sink fin with a first threaded knurl comprising a first thread of a first thread pitch and engaging a second heat sink fin with a second threaded knurl comprising a second thread of a second thread pitch. The method further includes engaging the first heat sink fin and the second heat sink fin with a heat sink base to fix rotation of the first heat sink fin and the second heat sink fin relative to the heat sink base about an axis orthogonal to a major surface of the heat sink base. The method further includes connecting the first threaded knurl with the second threaded knurl to fix rotation of first threaded knurl with the second threaded knurl about the axis orthogonal to the major surface of the heat sink base.

In another embodiment of the present invention, a method to fabricate an electronic device is claimed. The method includes engaging a first heat sink fin with a first threaded knurl comprising a first thread of a first thread pitch and engaging a second heat sink fin with a second threaded knurl comprising a second thread of a second thread pitch. The method further includes engaging the first heat sink fin and the second heat sink fin with a heat sink riser to fix rotation of the first heat sink fin and the second heat sink fin relative to the heat sink riser about an axis orthogonal to a major surface of the heat sink riser. The method further includes connecting the first threaded knurl with the second threaded knurl to fix rotation of first threaded knurl with the second threaded knurl about the axis orthogonal to the major surface of the heat sink riser.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4 depicts a heat sink fin for use in heat sink that includes heat sink fins separated by adjustable spacing, according to embodiments of the present invention.

FIG. 5 depicts threaded knurls for use in heat sink that includes heat sink fins separated by adjustable spacing, according to embodiments of the present invention.

FIG. 6 depicts a heat sink fin engaged with a threaded knurl for use in heat sink that includes heat sink fins separated by adjustable spacing, according to embodiments of the present invention.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Since traditional heat sink fin spacing is generally determined during initial design and generally fixed and since operating conditions of the electronic device vary during operation of the electronic device, the initially optimized fin spacing does not remain optimal during the course of operation of the electronic device.

As such, embodiments of the present invention are related to techniques of changing or adjusting the spacing between fins of a heat sink. The spacing of the heat sink fins may be dynamically adjusted based upon the current operating conditions of the electronic device to maintain an optimal temperature of the heat generating device during device operation.

Figure 1:
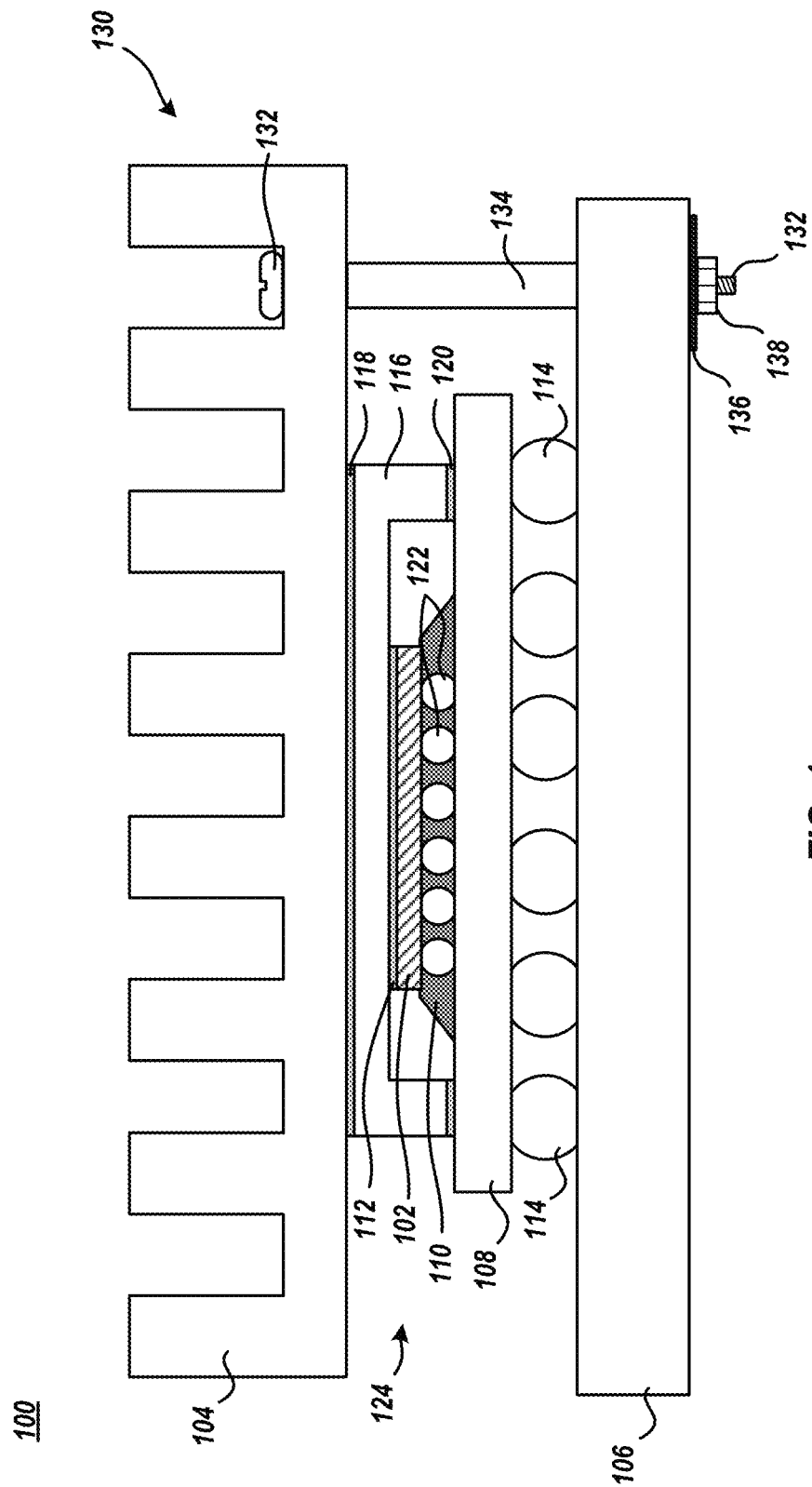
FIG. 1 depicts a prior art electronic device including a traditional heat sink.

FIG. 1 depicts a prior art electronic device 100 utilizing electronic package 124 which is cooled by a traditional heat sink 104. Electronic device 100 may be, for example, a computer, server, mobile device, kiosk, tablet, and the like. Electronic package 124 includes IC chip 102, carrier 108, interconnects 122, underfill 110, thermal interface material 112, lid 116, and adhesive 120. Chip 102 may be an integrated circuit, semiconductor die, processor, microchip, and the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, and the like. Underfill 110 may be electrically-insulating, may substantially surround interconnects 122, may electrically isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108 a lid 116 is attached to carrier 108 with adhesive 120 to cover chip 102. Generally, during operation of electronic device 100, heat needs to be removed from chip 102. In this situation, lid 116 is both a cover and a conduit for heat transfer. As such, a thermal interface material 112 may thermally join lid 116 and chip 102.

Electronic package 124 may be connected to a system board 106 via interconnects 114. System board 106 may be the main printed circuit board of electronic device 100 and includes electronic components, such as a graphics processing unit, memory, and the like, and provides connectors for other peripherals. Interconnects 114 electrically connect the lower side of carrier 108 to system board 106 and may be a wire bond, solder bond, stud, conductive ball, conductive button, and the like. Interconnects 114 may be larger and thus more robust than interconnects 122. When electronic package 124 is seated upon system board 106 a second reflow process may be performed to join interconnects 114 to electrical contacts of both carrier 108 and motherboard 106.

To assist in the removal of heat from chip 102 a heat sink 104 may be thermally joined to electronic package 124 via thermal interface material 118. Heat sink 104 may be a passive heat exchanger that cools chip 102 by dissipating heat into the surrounding air. As such, during operation of electronic device 100, a thermal path exists from chip 102 to heat sink 104 through thermal interface material 112, lid 116, and thermal interface material 118, and the like. Heat sink 104 includes a base 103 and fins 105. The lower surface of the base 103 may be thermally connected to lid 116 via thermal interface material 118. Fins 105 are connected to the upper side of base 103 and are generally spaced apart so as to allow air to exist, or flow, between each fin 105. Generally, the spacing between any neighboring fins 105 upon the heat sink 104 is constant.

Heat sink 104 may be connected to system board 106 via one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon electronic package 124 by heat sink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heat sink 104 upon electronic package 124.

Thermally connected, joined, and the like, shall herein mean that elements that which are thermally connected transfer heat there between by at least indirect conduction and wherein air gaps between the elements are reduced. Electrically connected, and the like, shall herein mean that current is able to be intentionally passed from one element to another element (e.g., current flows from a conductor in one element to a conductor in the other element).

Figure 2:
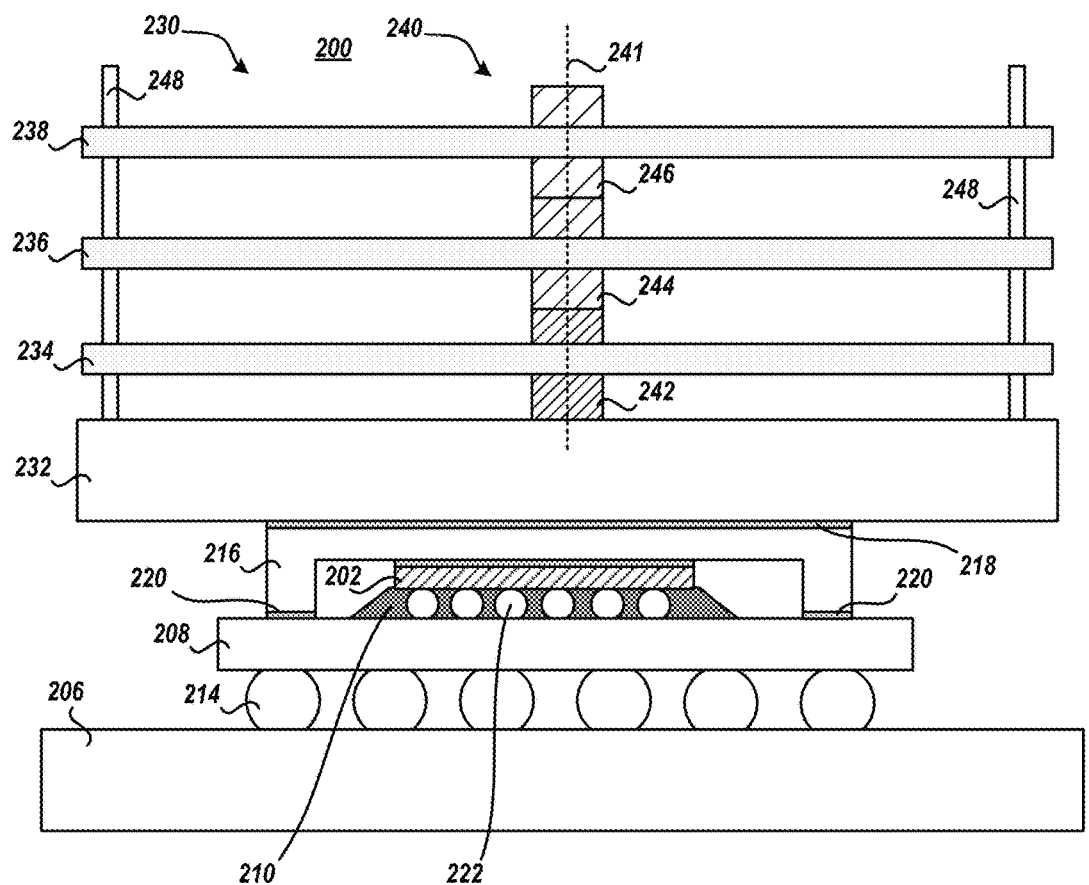
FIG. 2 and FIG. 3 depict an electronic device including an electronic package and a heat sink that includes heat sink fins separated by adjustable spacing, according to embodiments of the present invention.

FIG. 2 depicts an electronic device 200 including an electronic package and a heat sink 230 that includes heat sink fins separated by adjustable spacing. Electronic device 200 includes electronic package 224 which is cooled by heat sink 230. Electronic device 200 may be a computer, server, mobile device, kiosk, tablet, and the like. Electronic package 224 includes IC chip 202, carrier 208, interconnects 222, underfill 210, thermal interface material 212, lid 216, and adhesive 220.

Chip 202 may be an integrated circuit, semiconductor die, processor, microchip, and the like. Carrier 208 may be an organic carrier or a ceramic carrier and provides mechanical support for chip 202 and electrical paths from the upper surface of carrier 208 to the opposing side of carrier 208. Interconnects 222 electrically connect chip 202 and the upper side of carrier 208 and may be a wire bond, solder bond, stud, conductive ball, conductive button, and the like. Underfill 210 may be electrically-insulating, may substantially surround interconnects 222, may electrically isolate individual interconnects 222, and may provide mechanical support between chip 202 and carrier 208. Underfill 210 may also prevent damage to individual interconnects 222 due to thermal expansion mismatches between chip 202 and carrier 208.

When chip 202 is seated upon carrier 208, a reflow process may be performed to join interconnects 222 to electrical contacts of both chip 222 and carrier 208. After chip 202 is seated to carrier 208, lid 216 is attached to carrier 208 with adhesive 220 to cover chip 202. Generally, during operation of electronic device 200, heat needs to be removed from chip 202. In this situation, lid 216 is both a cover and a conduit for heat transfer. As such, a thermal interface material 212 may thermally join lid 216 and chip 202.

Electronic package 224 may be connected to a system board 206 via interconnects 214. System board 206 may be the main printed circuit board of electronic device 200 and includes electronic components, such as a graphics processing unit, memory, and the like, and provides connectors for other peripherals. Interconnects 214 electrically connect the lower side of carrier 208 to system board 206 and may be a wire bond, solder bond, stud, conductive ball, conductive button, and the like. Interconnects 214 may be larger and thus more robust than interconnects 222. When electronic package 224 is seated upon system board 206 a second reflow process may be performed to join interconnects 214 to electrical contacts of both carrier 208 and system board 206.

To increase the amount of heat removed from chip 202, heat sink 230 is thermally joined to electronic package 224 via thermal interface material 218. Heat sink 230 includes heat sink fins 234, 236, and 238 separated by adjustable spacing. Though three heat sink fins 234, 236, and 238 are depicted as included within heat sink 230, additional heat sink fins may be included. Heat sink 230 also includes a base 232 and threaded rod 240. Heat sink 230 may also include one or more posts 248. Threaded rod 240 includes a knurl 242, knurl 244, and knurl 246. Each knurl 242, knurl 244, and knurl 246 has a thread of differing thread pitch.

The spacing between fins 234, 236, and 238 may be adjusted generally by rotating threaded rod 240. In embodiments, the degree of threaded rod 240 rotation and result spacing of the heat sink fins may be adjusted based upon the current operating conditions of the electronic device 200 to maintain an optimal temperature of the chip 202 device 200 operation.

Heat sink 230 may be a passive heat exchanger that cools chip 202 by dissipating heat into the air surrounding fins 234, 236, and 238. As such, during operation of electronic device 200, a thermal path exists from chip 202 to fins 234, 236, and 238. More specifically, heat may be transferred from chip 202, to base 232, to threaded rod 240 and to posts 248, and to fins 234, 236, and 238.

Base 232 may be a solid slab that is generally larger in dimension than the underlying lid 216. Base 232 may be fabricated from a material having a high coefficient of heat transfer such as a metal. In a particular embodiment base 232 may be fabricated from copper, aluminum, or the like. The lower surface of the base 232 may be thermally connected to lid 216 via thermal interface material 218. In another embodiment, base 232 may include known heat transfer apparatus(es), such as one or more heat pipes, etc. Base 232 generally has a width dimension along the x-axis which is greater than a height dimension along the y-axis.

Posts 248 are generally fixed to base 232. Posts 248 may be generally cynical and are generally parallel extending in the y-axis direction from the upper side of base 232. Post 248 may be alignment pins to properly align fins 234, 236, and 238 to base 232. In such embodiments, posts 248 may engage with openings, through holes, and the like in associated locations of fins 234, 236, and 238. The openings may be approximately the same diameter than posts 248 so as to limit rotation of the fins 234, 236, and 238 relative to base 232. For example, the diameter of the openings may be about 2-4 millimeters larger than the diameter of posts 248. Posts 248 may be fixed to base 238 by known fastening techniques such as soldering, screwing, and the like. In a particular implementation, there may be a particular post 248 at corresponding edges of base 232. For example, if base 232 is an octagonal shape, there may be eight posts 248 at each base 232 vertex or edge, if base 232 is an square shape, there may be four posts 248 at each base 232 vertex or edge, etc. Posts 248 may have generally smooth vertical sidewalls to limit frictional forces that oppose movement of fins 234, 236, and 238 against the post 248 vertical sidewalls. Therefore, posts 248 may be fabricated from a material that has a high coefficient of heat transfer that also may be polished to smooth its vertical sidewalls. For example, posts 248 may be fabricated from copper, aluminum, stainless steel, and the like. Posts have a height dimension along with y-axis which is greater than the vertical displacement of fin 238 relative to base 232. In other words, when fin 238 is located in the maximum position away from base 232, posts 248 may still be engaged with the openings in fin 238. The posts 248 can be solid or hollow and may have heat pipes or vapor chambers embedded therewithin.

Threaded rod 240 includes knurl 242, knurl 244, and knurl 246. Each knurl 242, knurl 244, and knurl 246 has a thread of differing thread pitch. Each knurl 242, knurl 244, and knurl 246 may be generally a metallic member that has a height greater than width with a threaded knurled outside surface. In an embodiment, each knurl may have an opening in the y-axis direction. In an embodiment, knurl 242, knurl 244, and knurl 246 interlock with its neighboring knurl, respectively, so that knurl 242, knurl 244, and knurl 246 rotate about axis 241 together. For example, if a rotating force about axis 241 is applied to knurl 246 or knurl 242; knurls 242, knurl 244, and knurl 246 rotate about axis 241. The threaded rod 240, generally, or one or more knurls 242, 244 and 246, specifically, can be solid or hollow and may have heat pipes or vapor chambers embedded therewithin.

Each knurl 242, knurl 244, and knurl 246 engages with a respective fin 234, fin 236, or fin 238. For example, fin 234 has a threaded opening with the same thread pitch as knurl 242 so that knurl 242 is able to engage with fin 234, fin 236 has a threaded opening with the same thread pitch as knurl 244 so that knurl 244 is able to engage with fin 236, and fin 238 has a threaded opening with the same thread pitch as knurl 246 so that knurl 246 is able to engage with fin 238. In other words, the threads of knurl 242 engage with the treads of the threaded opening of fin 234, the threads of knurl 244 engage with the treads of the threaded opening of fin 236, and the threads of knurl 246 engage with the treads of the threaded opening of fin 238.

Each knurl 242, knurl 244, and knurl 246 has a thread of differing thread pitch, and in a particular embodiment, the thread pitch of the knurls increase in proportion to the distance of the knurl away from base 232. For example, knurl 242 has the smallest thread pitch since it is closest to base 232, knurl 244 has a larger thread pitch since it is located further away from base 232, and knurl 246 has the largest thread pitch since it is located furthest away from base 232. This proportionality allows the fins to be displaced against their respective knurl with a dimension also proportional to the distance away from base 232. For example, fin 238 is displaced against knurl 246 along axis 241 by the largest dimension, fin 236 is displaced against knurl 244 along axis 241 by a smaller dimension, and fin 234 may displaced against knurl 242 along axis 241 by the smallest dimension. In an embodiment, the height of threaded rod 240 from base 232 is less than the height of posts 248 from base 232.

The term tread, and the like, means a helical ridge used to convert between rotational and linear movement. Therefore, the thread of the knurls is a helical ridge wrapped around the outer surface.

In the embodiment depicted in FIG. 2, the fin 234, fin 236, and fin 238 are parallel with the top surface of base 232 and have approximately the same width in the x-dimension and z-dimension as base 232. In other words the major surface (i.e. surface of largest area) of the fins is parallel to the major surface of base 232. Though three fins 234, 236, and 238 are shown more fins may be included within heat sink 230. In some embodiments, more than one fin may be engaged with a particular knurl. In embodiments, references to particular knurls of threaded rod 240 may be references to particular portions of threaded rod 240.

Figure 3:
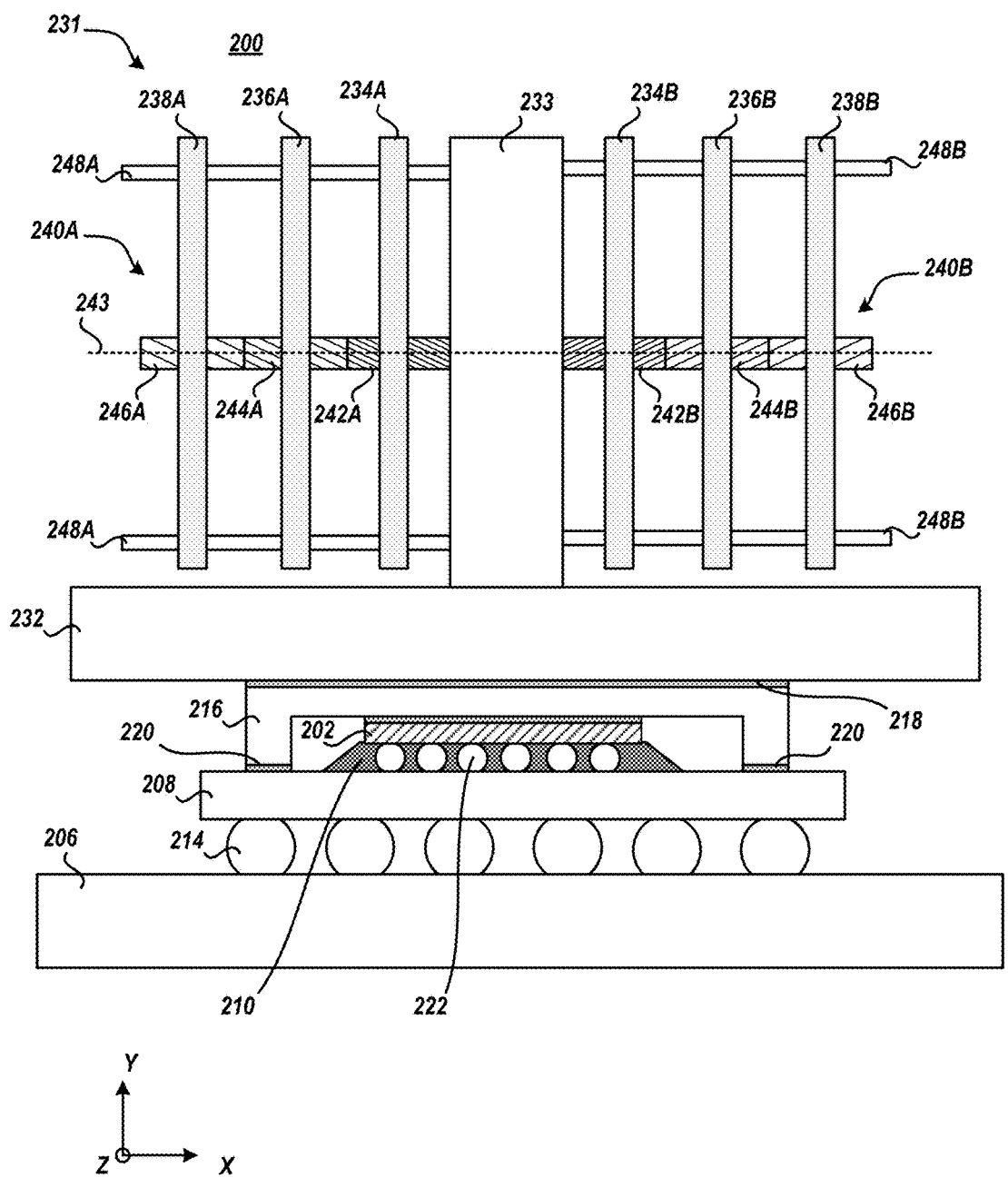

FIG. 3 depicts electronic device 200 including an electronic package and a heat sink 231 that includes heat sink fins separated by adjustable spacing. Electronic device 200 includes electronic package 224 which is cooled by heat sink 231.

To increase the amount of heat removed from chip 202, heat sink 231 is thermally joined to electronic package 224 via thermal interface material 218. Heat sink 231 includes heat sink fins 234A, 236B, 238C separated by adjustable spacing and heat sink fins 234B, 236B, 238B separated by adjustable spacing. Heat sink 231 also includes a base 232, riser 233, threaded rod 240A, and threaded rod 240B. Heat sink 231 may also include one or more posts 248A and one or more posts 248B. Threaded rod 240A includes a knurl 242A, knurl 244A, and knurl 246A. Threaded rod 240B includes a knurl 242B, knurl 244B, and knurl 246B. Each knurl 242A, knurl 244A, and knurl 246A has a thread of differing thread pitch. Likewise, each knurl 242B, knurl 244B, and knurl 246B has a thread of differing thread pitch. Knurl 242A and 242B may have the same thread pitch, knurl 244A and 244B may have the same thread pitch, and knurl 246A and 246B may have the same thread pitch. Knurl 242A and 242B may have oppositely orientated thread pitches, knurl 244A and 244B may have oppositely orientated thread pitches, and knurl 246A and 246B may have oppositely orientated thread pitches.

The spacing between fins 234A, 236A, and 238A may be adjusted generally by rotating threaded rod 240A. The spacing between fins 234B, 236B, and 238B may be adjusted generally by rotating threaded rod 240B. In embodiments, the degree of threaded rod 240A and/or threaded rod 240B rotation and result spacing of the heat sink fins may be adjusted based upon the current operating conditions of the electronic device 200 to maintain an optimal temperature of the chip 202 device 200 operation. In some embodiments, threaded rod 240A may rotate independently from threaded rod 240B. In other embodiments, threaded rod 240A and threaded rod 240B are joined and, therefore, rotate together.

Heat sink 231 may be a passive heat exchanger that cools chip 202 by dissipating heat into the air surrounding fins 234A, 236A, 238A, 234B, 236B, and 238B. As such, during operation of electronic device 200, a thermal path exists from chip 202 to fins 234A, 236A, 238A, 234B, 236B, and 238B. More specifically, heat may be transferred from chip 202; to base 232; to riser 233; to threaded rod 240A, to threaded rod 240B, to posts 248A and posts 248B; and to fins 234A, 236A, 238A, 234B, 236B, and 238B.

Riser 233 may be a solid slab that is generally larger in height dimension in the y-axis than width in the x-axis. Riser 233 may be fabricated from a material having a high coefficient of heat transfer such as a metal. In a particular embodiment riser 233 may be fabricated from copper, aluminum, or the like. The lower surface of the riser 233 may be thermally connected to base 232 either directly or via a thermal interface material. In another embodiment, riser 233 may include known heat transfer apparatus(es), such as one or more heat pipes, etc.

Posts 248A are generally fixed to the left vertical surface of riser 233. Posts 248B are generally fixed to the right vertical surface of riser 233. In embodiments, respective posts 248A and posts 248B are a single post 248, interconnected, etc. Posts 248A and posts 248B may be generally cynical and are generally parallel extending in the x-axis direction from sides of riser 233. Post 248A and posts 248B may be alignment pins to properly align fins 234A, 236A, 238A, 234B, 236B, and 238B, respectively. In such embodiments, posts 248A and posts 248B may engage with openings, through holes, and the like in associated locations of fins 234A, 236A, 238A, 234B, 236B, and 238B, respectively. The openings may be approximately the same diameter as posts 248A or posts 248B so as to limit rotation of the fins 234A, 236A, 238A, 234B, 236B, and 238B about axis 243, respectively. For example, the diameter of the openings may be about 2-4 millimeters larger than the diameter of posts 248A and posts 248B.

Posts 248A and posts 248B may be fixed to riser 233 by known fastening techniques such as soldering, screwing, and the like. In a particular implementation, there may be a particular post 248A and/or post 248B at corresponding edges of riser 233. For example, if riser 233 is a rectangular shape, there may be four posts 248A at each riser 233 vertex or edge extending from the left side of riser 233 and there may be four posts 248B at each riser 233 vertex or edge extending from the right side of riser 232. Posts 248A and posts 248B may have generally smooth vertical sidewalls to limit frictional forces that oppose movement of 234A, 236A, 238A, 234B, 236B, and 238B against the post 248A or post 248B vertical sidewalls, respectively. Therefore, posts 248A and posts 248B may be fabricated from a material that has a high coefficient of heat transfer that also may be polished to smooth its vertical sidewalls. For example, posts 248A and posts 248B may be fabricated from copper, aluminum, stainless steel, and the like. Posts 248A and posts 248B have a width dimension along with x-axis which is greater than the vertical displacement of fin 238A or fin 238B, respectively, relative to riser 233. In other words, when fin 238A is located in the maximum position away from riser 233, posts 248A may still be engaged with the openings in fin 238A and when fin 238B is located in the maximum position away from riser 233, posts 248B may still be engaged with the openings in fin 238B. The posts 248A and 248B may be solid or hollow and may have heat pipes or vapor chambers embedded therewithin.

Threaded rod 240A includes knurl 242A, knurl 244A, and knurl 246A. Each knurl 242A, knurl 244A, and knurl 246A has a thread of differing thread pitch. Each knurl 242A, knurl 244A, and knurl 246A may be generally a metallic member that has a width in the x-axis greater than height in the y-axis with a threaded knurled outside surface. In an embodiment, each knurl 242A, knurl 244A, and knurl 246A may have an opening in the x-axis direction. In an embodiment, knurl 242A, knurl 244A, and knurl 246A interlock with its neighboring knurl, respectively, so that knurl 242A, knurl 244A, and knurl 246A rotate about axis 243 together. For example, if a rotating force about axis 243 is applied to knurl 246A or knurl 242A; knurls 242A, knurl 244A, and knurl 246A rotate about axis 243.

Threaded rod 240B includes knurl 242B, knurl 244B, and knurl 246B. Each knurl 242B, knurl 244B, and knurl 246B has a thread of differing thread pitch. Each knurl 242B, knurl 244B, and knurl 246B may be generally a metallic member that has a width in the x-axis greater than height in the y-axis with a threaded knurled outside surface. In an embodiment, each knurl 242B, knurl 244B, and knurl 246B may have an opening in the x-axis direction. In an embodiment, knurl 242B, knurl 244B, and knurl 246B interlock with its neighboring knurl, respectively, so that knurl 242B, knurl 244B, and knurl 246B rotate about axis 243 together. For example, if a rotating force about axis 243 is applied to knurl 246B or knurl 242B; knurls 242B, knurl 244B, and knurl 246B rotate about axis 243. The threaded rods 240 A, 240B, generally, or one or more knurls 242A, 242B, 244A, 244B and 246A, 246B, specifically, can be solid or hollow and may have heat pipes or vapor chambers embedded therewithin Each knurl 242A, knurl 244A, and knurl 246A engages with a respective fin 234A, fin 236A, or fin 238A. For example, fin 234A has a threaded opening with the same thread pitch as knurl 242A so that knurl 242A is able to engage with fin 234A, fin 236A has a threaded opening with the same thread pitch as knurl 244A so that knurl 244A is able to engage with fin 236A, and fin 238A has a threaded opening with the same thread pitch as knurl 246A so that knurl 246A is able to engage with fin 238A. In other words, the threads of knurl 242A engage with the treads of the threaded opening of fin 234A, the threads of knurl 244A engage with the treads of the threaded opening of fin 236A, and the threads of knurl 246A engage with the treads of the threaded opening of fin 238A.

Each knurl 242B, knurl 244B, and knurl 246B engages with a respective fin 234B, fin 236B, or fin 238B. For example, fin 234B has a threaded opening with the same thread pitch as knurl 242B so that knurl 242B is able to engage with fin 234B, fin 236B has a threaded opening with the same thread pitch as knurl 244B so that knurl 244B is able to engage with fin 236B, and fin 238B has a threaded opening with the same thread pitch as knurl 246B so that knurl 246B is able to engage with fin 238B. In other words, the threads of knurl 242B engage with the treads of the threaded opening of fin 234B, the threads of knurl 244B engage with the treads of the threaded opening of fin 236B, and the threads of knurl 246B engage with the treads of the threaded opening of fin 238B.

Each knurl 242A, knurl 244A, and knurl 246A has a thread of differing thread pitch, and in a particular embodiment, the thread pitch of 242A, knurl 244A, and knurl 246A increase in proportion to the distance of the knurl away from riser 233 along the x-axis. For example, knurl 242A has the smallest thread pitch since it is closest to riser 233, knurl 244A has a larger thread pitch since it is located further away from riser 233, and knurl 246A has the largest thread pitch since it is located furthest away from riser 233. This proportionality allows the fins 234A, 236A, and 238A to be displaced against their respective knurl with a dimension also proportional to the distance away from riser 233. For example, fin 238A is displaced against knurl 246A along axis 243 by the largest dimension, fin 236A is displaced against knurl 244A along axis 243 by a smaller dimension, and fin 234A is displaced against knurl 242A along axis 243 by the smallest dimension. In an embodiment, the height of threaded rod 240A from riser 233 is less than the height of posts 248A from riser 233.

Likewise, each knurl 242B, knurl 244B, and knurl 246B has a thread of differing thread pitch, and in a particular embodiment, the thread pitch of 242B, knurl 244B, and knurl 246B increase in proportion to the distance of the knurl away from riser 233 along the x-axis. For example, knurl 242B has the smallest thread pitch since it is closest to riser 233, knurl 244B has a larger thread pitch since it is located further away from riser 233, and knurl 246B has the largest thread pitch since it is located furthest away from riser 233. This proportionality allows the fins 234B, 236B, and 238B to be displaced against their respective knurl with a dimension also proportional to the distance away from riser 233. For example, fin 238B is displaced against knurl 246B along axis 243 by the largest dimension, fin 236B is displaced against knurl 244B along axis 243 by a smaller dimension, and fin 234B is displaced against knurl 242B along axis 243 by the smallest dimension. In an embodiment, the height of threaded rod 240B from riser 233 is less than the height of posts 248B from riser 233.

In the embodiment depicted in FIG. 3, the fins are perpendicular with the top surface of base 232 and have approximately the same width in z-dimension as base 232. In other words the major surface of the fins is perpendicular to the major surface of base 232. Though six fins are shown, more fins may be included within heat sink 231. In some embodiments, more than one fin may be engaged with a particular knurl. In embodiments, references to particular knurls of threaded rod 240A and threaded rod 240B may be references to particular portions of threaded rod 240A and threaded rod 240B, respectively.

FIG. 4 depicts a heat sink fin 250 for use in a heat sink that includes heat sink fins separated by adjustable spacing, according to embodiments of the present invention. Heat sink fin 250 is designated herein as a generic or exemplary fin 234, 236, 238, 234A, 236A, 238A, 234B, 236B, and/or 238B. Heat sink fin 250 may be a solid block fabricated of a material having a high degree of thermal conductivity (i.e. copper, aluminum, etc.). In other embodiments, additional heat transfer devices may be included within the fin 250 between the top major surfaces of the fin 250 and the bottom major surface of the fin 250. The fin 250 includes locating openings 252 and threaded opening 254. Locating openings 252 are configured to accept posts 248, 248A, or 248B. Locating openings 252 may be located at the edges or vertices of fin 250. The diameter of openings is approximately the same (e.g. 2-4 mm larger) as the diameter of posts 248, 248A, or 248B. When posts 248, 248A, or 248B are engaged within openings 252, posts 248, 248A, or 248B rotation of fin in relation to base 232 or riser 233 is prevented, respectively. The inner surfaces of openings 252 may be smoothed to reduce frictional forces between the fin 250 and posts 248, 248A, or 248B so as to promote the ability of fin 250 to move along axis 242, 243 against posts 248, 248A, or 248B, respectively.

Threaded opening 256 generally engages with a particular knurl such that threaded opening 256 has the appropriate dimension and thread pitch to allow the threads of opening 256 to engage with the threads of the particular knurl. Threaded opening 256 may be centrally located upon the major surfaces of fin 250.

FIG. 5 depicts threaded knurls 258A and 258B for use in a heat sink that includes heat sink fins separated by adjustable spacing, according to embodiments of the present invention. Threaded knurls 258A and 258B are designated herein as generic or exemplary knurls 242, 244, 246, 242A, 244A, 246A, 242B, 244B, 246B. Knurl 258A includes a thread 259A (not depicted) upon the major outer surface thereof. On a first surface (upper or lower) knurl 258A includes one or more protrusions 260A extending therefrom. Knurl 258A may also include a central opening 262A extending from the upper surface to the lower surface that form an internal surface thereto. In some embodiments, one or more features of the internal surface may engage with a motor or other rotation device to rotate the knurl 258A. On a second opposing surface (lower or upper) to the first surface, knurl 258A includes one or more receptacles 260A extending inward therefrom. Receptacles 260A generally receive protrusions 260B of a neighboring knurl 258B such that knurl 258A and knurl 258B rotate together about central axis 265.

Similarly, knurl 258B includes a thread 259B (not depicted) upon the major outer surface thereof. On a first surface (upper or lower) knurl 258B includes one or more protrusions 260B extending therefrom. Knurl 258B may also include a central opening 262B extending from the upper surface to the lower surface that form an internal surface thereto. In some embodiments, one or more features of the internal surface may engage with a motor or other rotation device to rotate the knurl 258B. On a second opposing surface (lower or upper) to the first surface, knurl 258B includes one or more receptacles 260B extending inward therefrom. Receptacles 260B generally receive protrusions of a neighboring knurl such that knurl 258B and the neighboring knurl (if present) rotate together about central axis 265.

FIG. 6 depicts heat sink fin 250 engaged with threaded knurl 258 (i.e. 258A or 258B) for use in a heat sink that includes heat sink fins separated by adjustable spacing, according to embodiments of the present invention. In some embodiments, knurl 258 may be engaged with fin 250 to form a heat sink fin assembly. The knurl 258 may be engaged to the fin 250 such that the threads of knurl 258 engage with the threads of the threaded opening of fin 250 so that fin 250 is located with respect to the knurl 258 at a reference location. The reference location may be the middle of the knurl 258 (i.e. the central plan between the top and bottom surfaces there).

Figure 7:
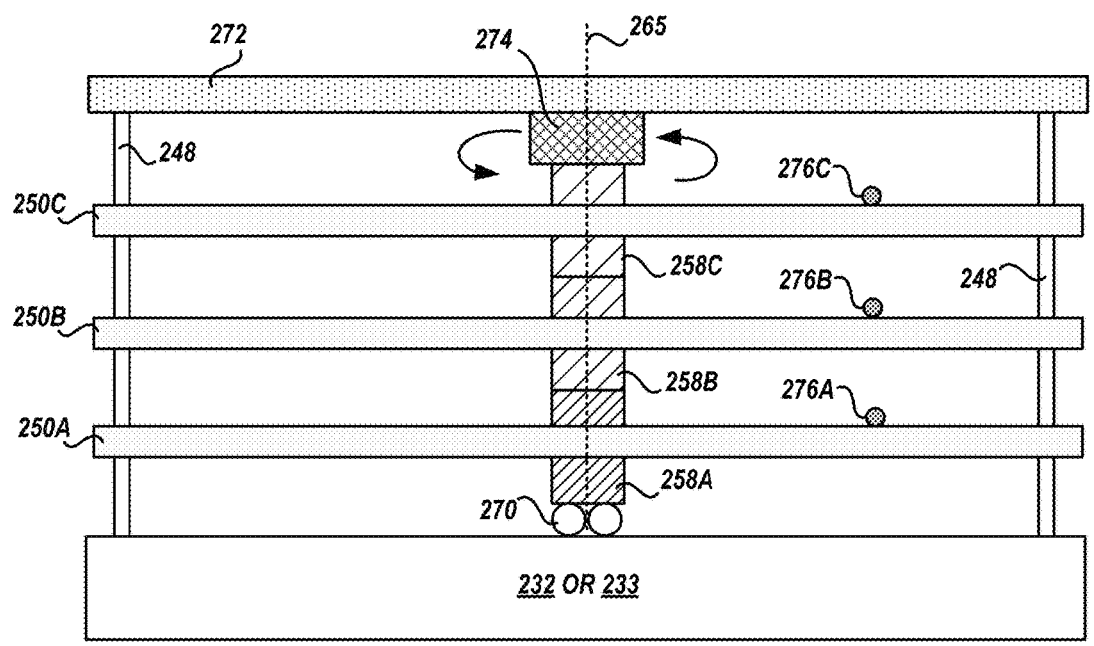
FIG. 7-FIG. 10 depicts heat sinks that include heat sink fins separated by adjustable spacing, according to embodiments of the present invention.

FIG. 7 depicts heat sink 230 or 231 that includes heat sink fins 250A-250C separated by adjustable spacing, according to embodiments of the present invention. Heat sink fins 250A-250C are distinct instances of heat sink fin 250. Likewise, knurls 258A-258C are distinct instances of threaded knurl 258. In the embodiment depicted in FIG. 7, a motor or other rotation device, herein referred to as motor 274 is connected to knurl 258C furthest away from base 232 or riser 233. Motor 274 may be connected to one or more features on the internal surface of knurl 258C. On the opposing side of threaded rod, which includes knurls 258A-258C, there may be a bearing 270 that allows knurl 258A to rotate against base 232 or riser 233 about axis 265. In another embodiment, the threaded rod may extend into a threaded opening of the heat sink base 232 or riser 233 to receive the threaded rod. In this embodiment, to prevent the threaded rod from disengaging from the heat sink base 232 or riser 233, a motion limit feature may be included upon the threaded rod to limit the rotation of the threaded rod such that the threaded rod does not disengage from the heat sink base 232 or riser 233. Motor 274 may also be connected to a plate 272 that is connected to heat sink 230 or 231 by posts 248. Plate 272 may have the same major surface dimensions compared to fin 250. The motor 272 may be electrically connected via a wired connection or wireless connection to a controller generally located upon system board 206. In a particular embodiment, motor 272 may be electrically connected to chip 202. In embodiments, each fin 250 may be associated with a temperature sensor 276, such as a thermocouple. For example, a temperature sensor 276A may be attached to the major surface of heat sink fin 250A, a temperature sensor 276B may be attached to the major surface of heat sink fin 250B, and a temperature sensor 276C may be attached to the major surface of heat sink fin 250C.

Each temperature sensor may be generally located upon the respective fin at an equal dimension away from axis 265. Each temperature sensor 276 generally measures the temperature of its associated fin. Each temperature sensor 276 may also be electrically connected to the controller. In another embodiment, rather than one or more temperature sensors being mounted to and measuring the temperature of one or more heat sink fins, one or more temperature sensors may be located upon or within and measure the temperature of chip 202. In an embodiment, the direction and degree of rotation about axis 265 of motor 274 and resultantly upon knurl 258C is determined by the controller utilizing each respective temperature of the temperature sensors.

Figure 8:
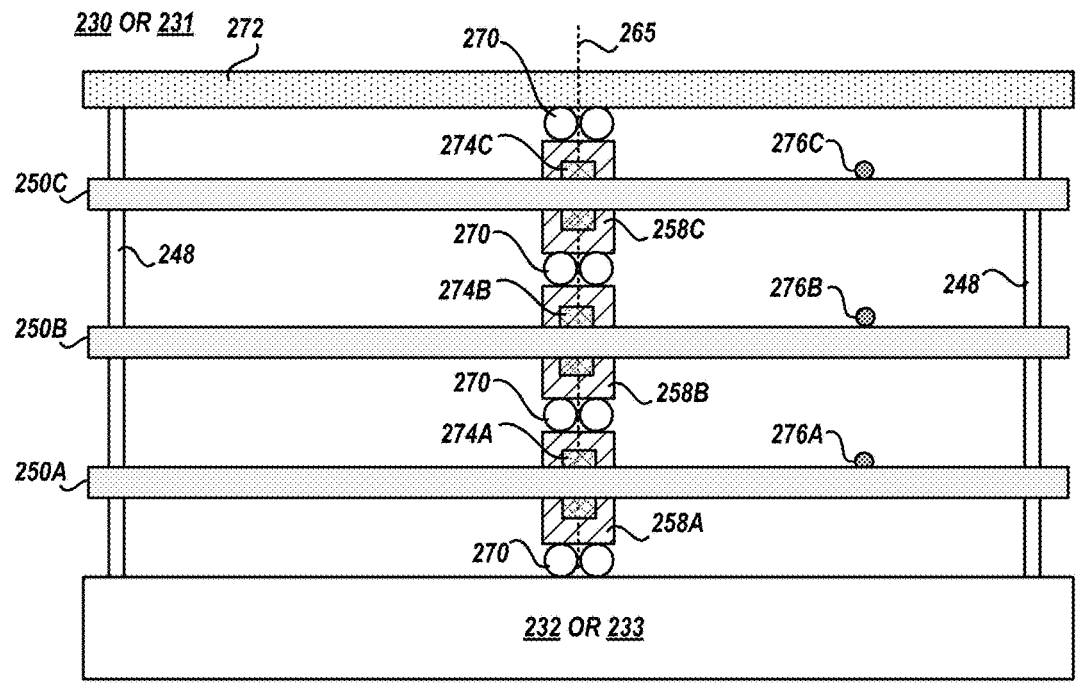

FIG. 8 depicts heat sink 230 or 231 that includes heat sink fins 250A-250C separated by adjustable spacing, according to embodiments of the present invention. In the depicted embodiment, each threaded knurls 258A-258C are distinct instances of threaded knurl 258 and are individually rotatable by an associated motor 274A, 274B, and 274C. Because each threaded knurl 258A-258C may be individually rotated, in the present embodiment, knurls 258A-258C need not have differing thread pitches. Motor 274A may be connected to one or more features on the internal surface of knurl 258A, motor 274AB may be connected to one or more features on the internal surface of knurl 258B, and motor 274C may be connected to one or more features on the internal surface of knurl 258C.

Because each threaded knurl 258A-258C may be individually rotated, in the present embodiment, a bearing 270 may separate neighboring knurl 258A-258C to allow the knurls to independently rotate against one another about axis 265. A bearing 270 may also separate knurl 258A and base 232 or riser 233. Further, a bearing 270 may also separate knurl 258C and plate 272. Each motor 274A-274C may be electrically connected via a wired connection or wireless connection to a controller generally located upon system board 206. In a particular embodiment, each motor 274A-274C is electrically connected to chip 202. In an embodiment, the degree of rotation about axis 265 of each individual motor 274A-274C and resultantly upon the associated knurl 258A-258C is determined by the controller utilizing the respective temperature of the associated temperature sensor 276A-276C upon each respective sink fin 250A-250C. For example, the temperate detected by sensor 276A is utilized as an input by the controller to determine the direction and degree that motor 274A independently rotates knurl 258A about axis 265.

Figure 9:
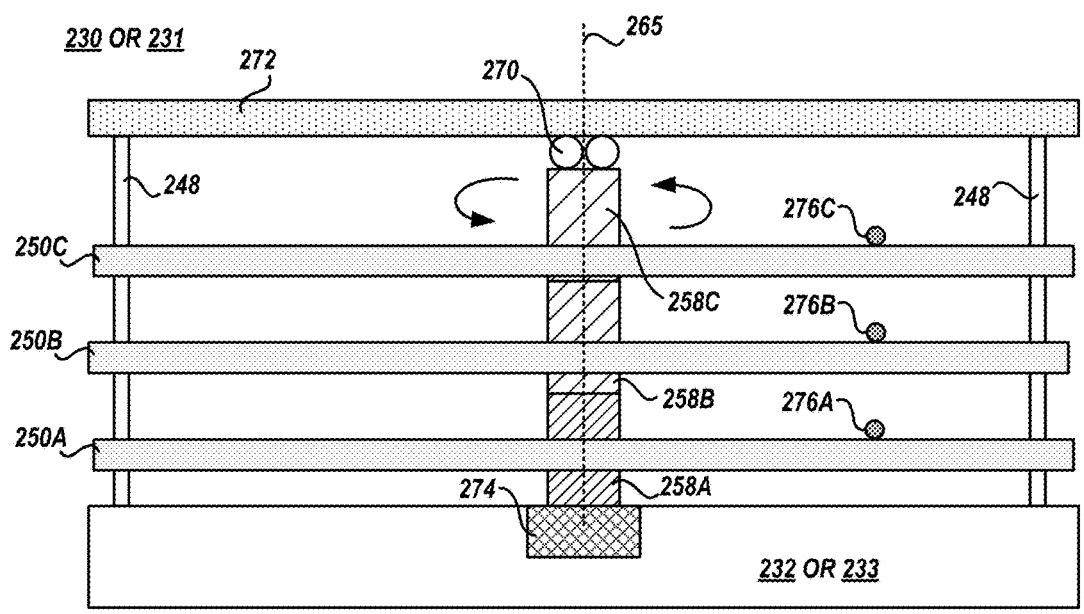

FIG. 9 depicts heat sink 230 or 231 that includes heat sink fins 250A-250C separated by adjustable spacing, according to embodiments of the present invention. In the embodiment depicted in FIG. 9, motor 274 is connected to base 232 or riser 233 and is connected to knurl 258A nearest to base 232 or riser 233 and together rotates knurls 258A, 258B, and 258C. Further, FIG. 9 depicts the movement of fins 250 or the adjustment of the spacing between fins 250 subsequent to motor 274 rotating the knurls about axis 265 in a counterclockwise direction.

When the knurls 258A, 258B, and 258C are rotated in the counterclockwise direction the threads of the knurls interact with the threads of the engaged threaded opening 256 of the respective fin 250 to convert the rotation of the knurls 258A, 258B, and 258C about axis 265 to linear movement toward base 232 or riser 233. The amount of displacement toward base 232 or riser 233 of each fin 250 is variable due to the differing thread pitches of each knurl 258A, 258B, and 258C. Therefore, fin 250C is displaced toward base 232 or riser 233 against knurl 258C by the greatest dimension, fin 250B is displaced toward base 232 or riser 233 against knurl 258B by less of a dimension, and fin 250A is displaced toward base 232 or riser 233 against knurl 258A by the smallest dimension. In a particular embodiment, the thread pitches of knurls 258A, 258B, and 258C are chosen to result in a first spacing between fin 250A and 250B and a second spacing between fin 250B and fin 250C to be constant irrespective of the degree of rotation of the knurls about axis 265. Throughout and subsequent to motor 274 rotating the knurls about axis 265 in a counterclockwise direction, the major surfaces of fins 250 remain parallel to base 232 or riser 233.

Figure 10:
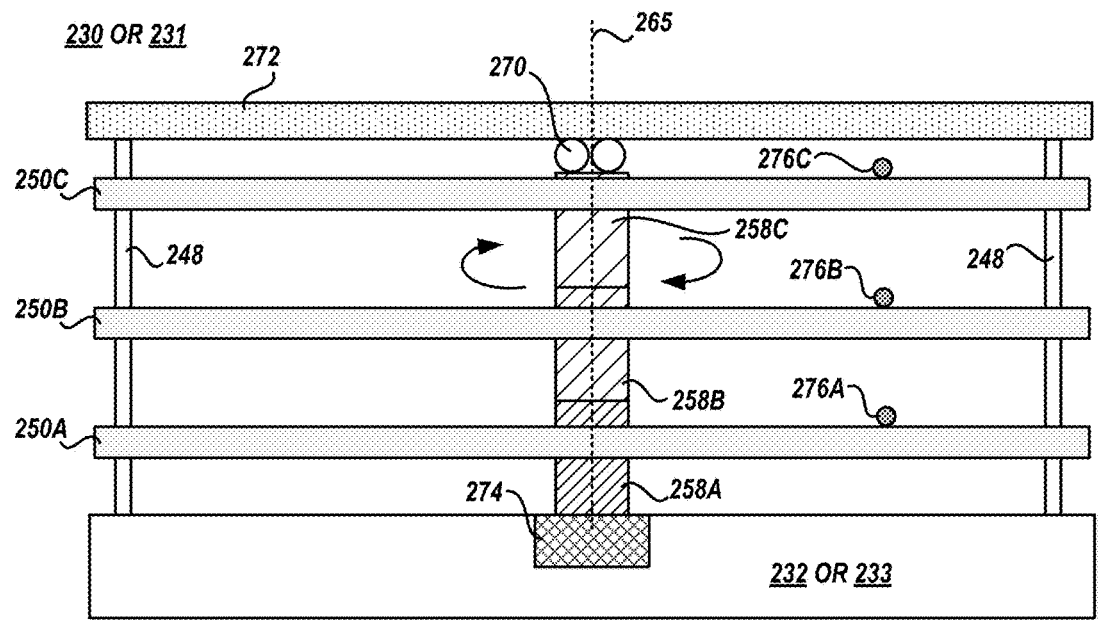

FIG. 10 depicts heat sink 230 or 231 that includes heat sink fins 250A-250C separated by adjustable spacing, according to embodiments of the present invention. In the embodiment depicted in FIG. 10, motor 274 is connected to base 232 or riser 233 and is connected to knurl 258A nearest to base 232 or riser 233 and together rotates knurls 258A, 258B, and 258C. Further, FIG. 10 depicts the movement of fins 250 or the adjustment of the spacing between fins 250 subsequent to motor 274 rotating the knurls about axis 265 in a clockwise direction.

When the knurls 258A, 258B, and 258C are rotated in the clockwise direction the threads of the knurls interact with the threads of the engaged threaded opening 256B of the respective fin 250 to convert the rotation of the knurls 258A, 258B, and 258C about axis 265 to linear movement away from base 232 or riser 233. The amount of displacement away from base 232 or riser 233 of each fin 250 is variable due to the differing thread pitches of each knurl 258A, 258B, and 258C. Therefore, fin 250C is displaced away from base 232 or riser 233 against knurl 258C by the greatest dimension, fin 250B is displaced away from base 232 or riser 233 against knurl 258B by less of a dimension, and fin 250A is displaced away from base 232 or riser 233 against knurl 258A by the smallest dimension. Throughout and subsequent to motor 274 rotating the knurls about axis 265 in the clockwise direction, the major surfaces of fins 250 remain parallel to base 232 or riser 233.

Figure 11:
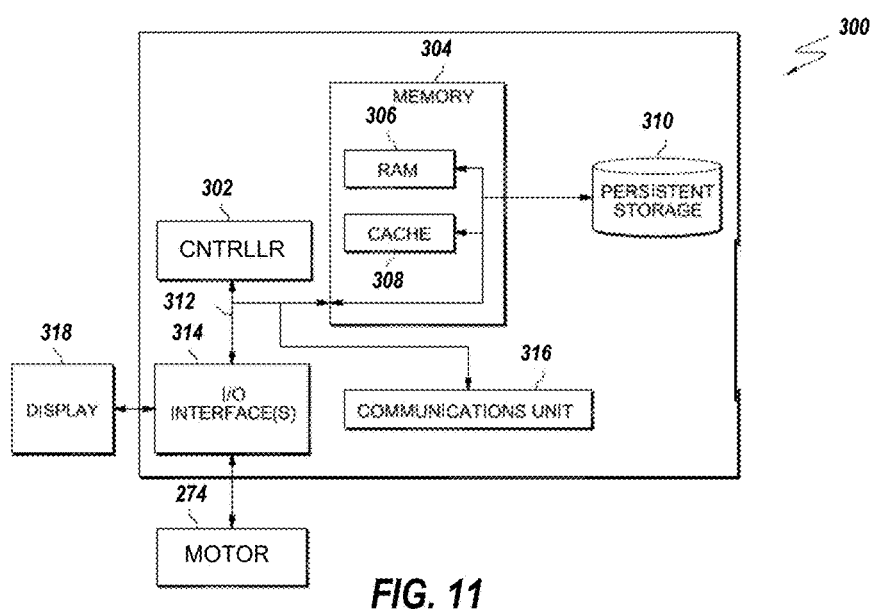
FIG. 11 depicts a block diagram of an electronic device for dynamically adjusting heat sink fin spacing, according to embodiments of the present invention.

FIG. 11 depicts a block diagram of an electronic device 300 for dynamically adjusting heat sink fin spacing, according to embodiments of the present invention. It should be appreciated that FIG. 11 provides only an illustration of one implementation of electronic device 300 that utilizes a heat sink 230 or 231 with adjustable fins.

Electronic device 300 includes communications bus 312, which provides communications between controller 302, memory 304, persistent storage 310, communications unit 316, and input/output (I/O) interface(s) 314. Controller 302 is a tangible processing device such as chip 202, a field programmable gate array (FPGA), application specific integrated circuit (ASIC), etc. Controller 302 determines the degree of rotation of motor 274 so as to adjust the spacing between heat sink fins of heat sink 230 or 231. Controller 302 may call program instructions stored in memory 304 along with one or more inputs from temperature sensors to determine the degree of rotation of motor 274 so as to adjust the spacing between heat sink fins of heat sink 230 or 231. The temperature sensors can be the temperature sensors mounted on the fins or temperature sensors upon or within the chip 202, such as a digital or other on-chip temperature sensor.

Memory 304 may be, for example, one or more random access memories (RAM) 306, cache memory 308, or any other suitable non-volatile or volatile storage device. Persistent storage 310 can include one or more of flash memory, magnetic disk storage device of an internal hard drive, a solid state drive, a semiconductor storage device, read-only memory (ROM), EPROM, or any other computer-readable tangible storage device that is capable of storing program instructions or digital information.

The media used by persistent storage 310 may also be removable. For example, a removable hard drive may be used for persistent storage 310. Other examples include an optical or magnetic disk that is inserted into a drive for transfer onto another storage device that is also a part of persistent storage 310, or other removable storage devices such as a thumb drive or smart card.

Communications unit 316 provides for communications with other electronic devices. Communications unit 316 includes one or more network interfaces. Communications unit 316 may provide communications through the use of either or both physical and wireless communications links. In other embodiments, electronic device 300 may be devoid of communications unit 316. Software may be downloaded to persistent storage 310 through communications unit 316.

I/O interface(s) 314 allows for input and output of data with other devices that may be connected to electronic device 300, such as motor 274 and temperature sensors 276. I/O 314 interface may further provide a connection to other external devices such as a camera, mouse, keyboard, keypad, touch screen, and/or some other suitable input device. I/O interface(s) 314 may also connect to display 318.

Display 318 provides a mechanism to display data to a user and may be, for example, a computer monitor. Alternatively, display 318 may be integral to electronic device 300 and may also function as a touch screen.

Figure 12:
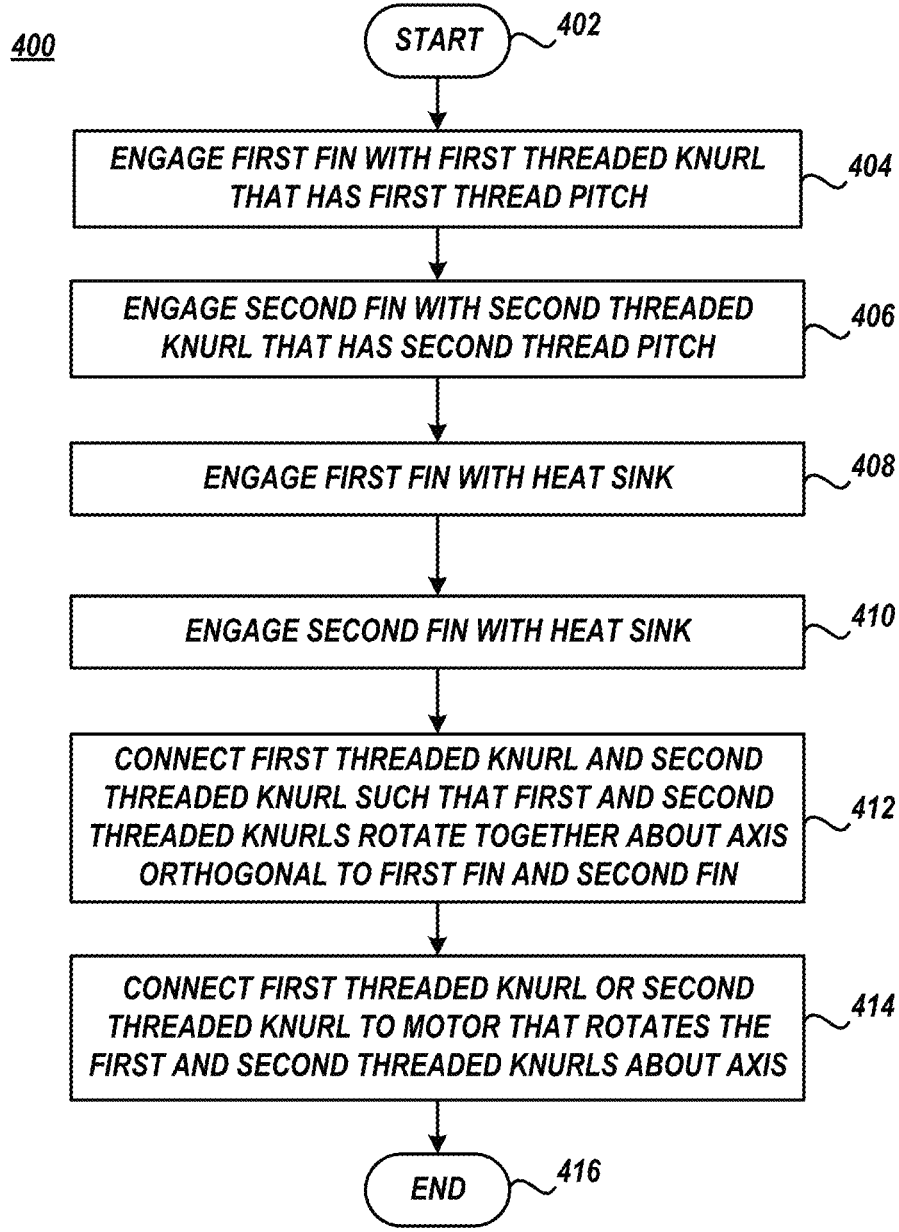
FIG. 12 depicts a method of installing a heat sink that includes heat sink fins separated by adjustable spacing, according to embodiments of the present invention.

FIG. 12 depicts a method 400 of installing a heat sink 230 or 231 that includes heat sink fins 250 separated by adjustable spacing, according to embodiments of the present invention. Method 400 may be exemplarily utilized by a device 300 fabricator, by an assembler of that attaches the heat sink 230 or 231 into device 300, etc. Method 400 beings at block 402 and continues with engaging a first fin 250A with a first threaded knurl 258A that has a first thread pitch (block 404). For example the threaded knurl 258A is screwed, rotated, or the like into threaded opening 256 of fin 250A, such that the treads of threaded knurl 258A interact with the treads of threaded opening 256 of fin 250A. In this manner, a first heat sink fin assembly comprising the first fin 250A and the threaded knurl 258A is formed. In some embodiments, a temperature sensor 276A may also be attached to the fin 250A.

Method 400 may continue with engaging a second fin 250B with a second threaded knurl 258B that has a second thread pitch (block 406). For example the threaded knurl 258B is screwed, rotated, or the like into threaded opening 256 of fin 250B, such that the treads of threaded knurl 258B interact with the treads of threaded opening 256 of fin 250B. In this manner, a second heat sink fin assembly comprising the first fin 250B and the threaded knurl 258B is formed. In some embodiments, a temperature sensor 276B may also be attached to the fin 250B.

Method 400 may continue with engaging the first fin 250A with the heat sink so as to fix the rotation of the first fin 250A with respect to the heat sink base 232 or riser 233 (block 408). For example, the first heat sink fin assembly is engaged with the heat sink base 232 or riser 233 by positioning posts 248 within openings 252 of heat sink fin 250A such that the posts 248 fix the rotation of the heat sink fin 250A relative to the heat sink base 232 or riser 233.

Method 400 may continue with engaging the second fin 250B with the heat sink so as to fix the rotation of the second fin 250B with respect to the heat sink base 232 or riser 233

(block 410). For example, the second heat sink fin assembly is engaged with the heat sink base 232 or riser 233 by positioning posts 248 within openings 252 of heat sink fin 250B such that the posts 248 fix the rotation of the heat sink fin 250B relative to the heat sink base 232 or riser 233.

Method 400 may continue with connecting the first threaded knurl 258A with the second threaded knurl 258B so that the first threaded knurl 258A and the second threaded knurl 258B rotate together about axis 265 which is orthogonal to the major surfaces of heat sink fin 250A and heat sink fin 250B (block 412). For example, second threaded knurl 258B is connected to first threaded knurl 258A such that receptacles 260A of first threaded knurl 258A receive protrusions 260B of knurl 258B.

Method 400 may continue with connecting the first threaded knurl or the second threaded knurl 258B with motor 274 that rotates the first threaded knurl and the second threaded knurl 258B together about axis 265 (block 414). For example, one or more features of the internal surface of knurl 258A or 258B connects with motor 274. In some embodiments, the motor 270 and temperature sensors 276A and 276B are electrically connected to controller 302. Method 400 ends at block 416.

Figure 13:
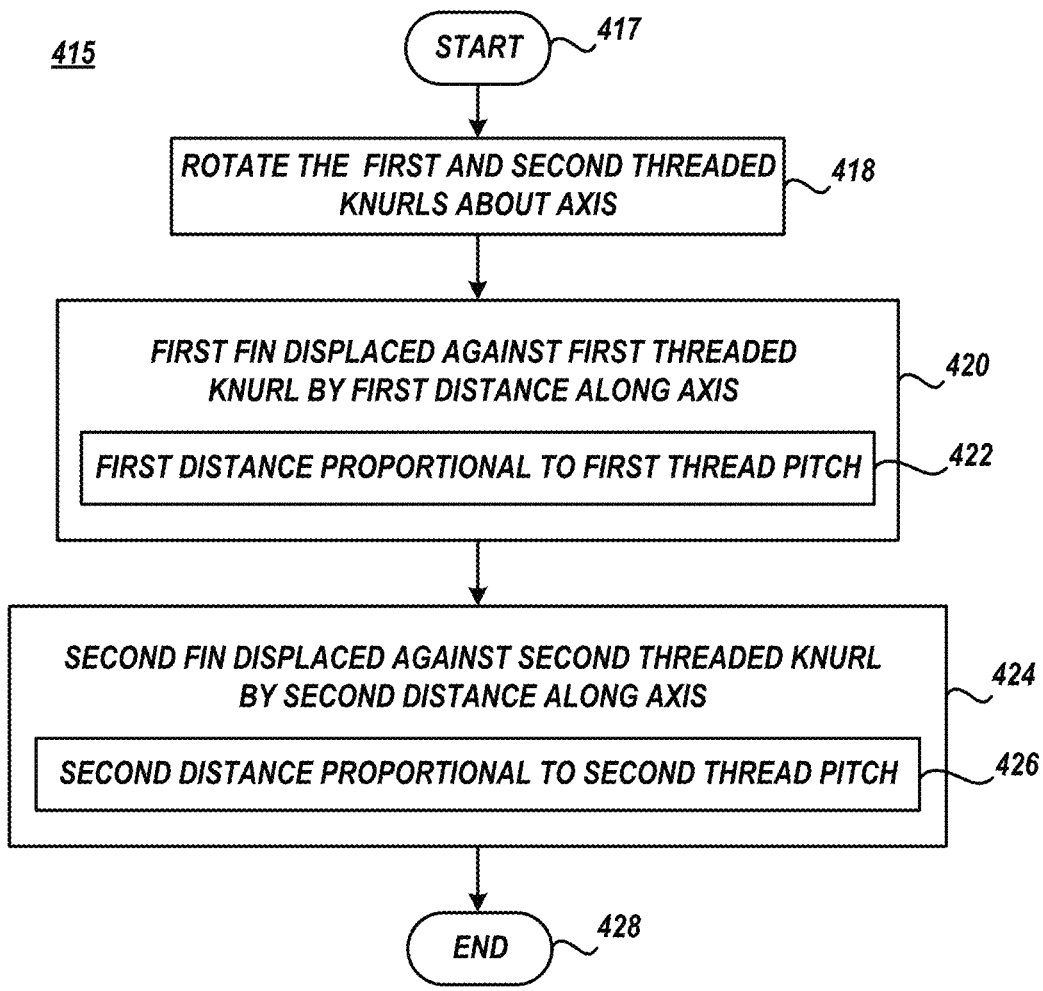
FIG. 13 depicts a method of adjusting heat sink fin spacing, according to embodiments of the present invention.

FIG. 13 depicts a method 415 of adjusting heat sink fin spacing, according to embodiments of the present invention. Method 415 may be exemplary utilized by a device 300 fabricator, by an assembler that attaches the heat sink 230 or 231 into device 300, etc. and rotates the threaded rod according to a predetermined configuration of the device 300. The rotation of the threaded rod may be provided by an electronic device such as motor 274, by a technician using a tool that engages with the treaded rod, or the like, during heat sink 230, 231 installation, device 300 serving, etc.

Method 415 begins at block 417 and continues with rotating the first threaded knurl 258A and the second threaded knurl 258B together about axis 265 which is orthogonal to the major surfaces of the first heat sink fin 250A and the second heat sink fin 250B (block 418).

Method 415 may continue with displacing the first fin 250A against the first threaded knurl 258A by a first dimension along axis 265 (block 420). For example, the knurls may be rotated in a clockwise or counterclockwise direction such that the threads of the knurl 258A interact with the threads of the threaded opening 256 of fin 250A to convert the rotation of the knurls about axis 265 to liner movement toward or away from base 232 or riser 233 along axis 265. In a particular embodiment, the distance or dimension of relative movement between the fin 250A against the first threaded knurl 258A along axis 265 is proportional to the thread pitch of the first threaded knurl 258A (block 422). For example, if the thread pitch of the first threaded knurl 258A is small, the distance the fin 250A moves against the first threaded knurl 258A is small.

Method 415 may continue with displacing the second fin 250B against the second threaded knurl 258B by a second dimension along axis 265 (block 424). For example, the knurls may be rotated in a clockwise or counterclockwise direction such that the threads of the knurl 258B interact with the threads of the threaded opening 256 of fin 250B to convert the rotation of the knurls about axis 265 to liner movement toward or away from base 232 or riser 233 along axis 265. In a particular embodiment, the distance or dimension of relative movement between the fin 250B against the threaded knurl 258B along axis 265 is proportional to the tread pitch of the threaded knurl 258B (block 426). For example, if the thread pitch of the threaded knurl 258B is larger than the thread pitch of knurl 258A, the distance the fin 250B moves against the threaded knurl 258B is larger than the distance the fin 250A moves against the threaded knurl 258A. Method 415 ends at block 428.

Figure 14:
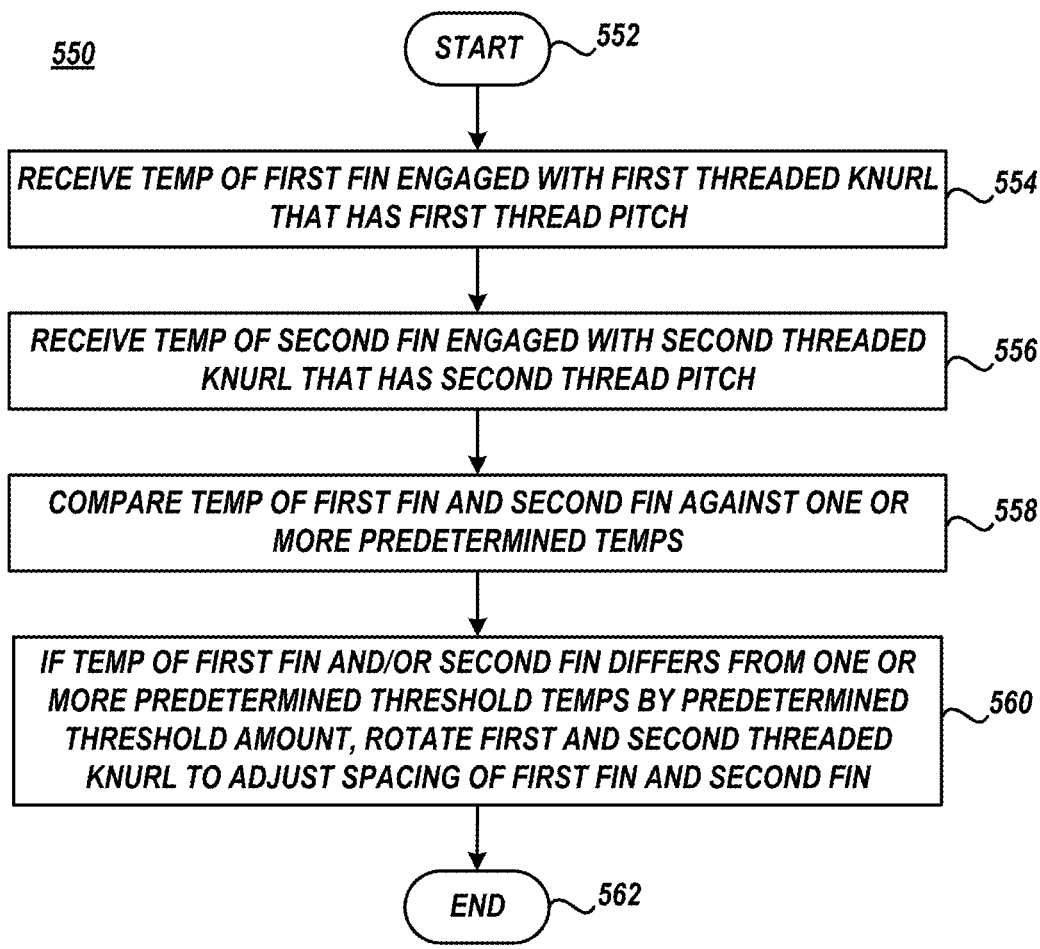
FIG. 14 depicts a method of dynamically adjusting heat sink fin spacing, according to embodiments of the present invention.

FIG. 14 depicts a method 550 of dynamically adjusting heat sink fin spacing, according to embodiments of the present invention. Method 550 begins at block 552 and continues with controller 302 receiving a sensed temperature of a first temperature sensor upon a first fin 250A that is engaged with a first threaded knurl 258A or within chip 202 that has a first thread pitch (block 554). In another embodiment, controller 302 receives a sensed temperature of a temperature sensor within chip 202.

Method 550 may continue with controller 302 receiving a sensed temperature of a second temperature sensor 276B upon a second fin 250B that is engaged with a second threaded knurl 258B that has a second thread pitch (block 556).

Method 550 may continue with controller 302 comparing the sensed temperature of the first temperature sensor 276A with a first predetermined temperature and comparing the sensed temperature of the second temperature sensor 276B with a second predetermined temperature (block 558). The first predetermined temperature may be defined as the expected temperature of the first fin 250A as a result of chip 202 operating under normal conditions. Likewise, the second predetermined temperature may be defined as the expected temperature of the second fin 250B as a result of the chip 202 operating under normal conditions. Normal operating conditions are the conditions, such as ambient conditions, input voltage, and output current, which are required for the proper functioning of chip 202. In another embodiment, controller 302 compares the sensed temperature of the temperature sensor within chip 202 with a third predetermined temperature. The third predetermined temperature may be defined as the expected temperature of the chip 202 operating under normal conditions.

Method 550 may continue with rotating the first threaded knurl 258A and the second threaded knurl 258 to adjust the spacing of the first fin 250A and the second fin 250B relative to base 232 or riser 233 if the sensed temperature of the first temperature sensor 276A differs from the first predetermined temperature by a threshold amount and/or if the sensed temperature of the second temperature sensor 276B differs from the second predetermined temperature by the threshold amount (block 560). For example, if the threshold amount is ten degrees, knurl 258A is rotated in a first direction (clockwise or counterclockwise) if the sensed temperature of the first temperature sensor 276A is greater than the first predetermined temperature by ten degrees or more and the knurl 258A is rotated in a second opposite direction if the sensed temperature of the first temperature sensor 276A is less than the first predetermined temperature by ten degrees or more. In another embodiment, the first threaded knurl 258A and the second threaded knurl 258 are rotated to adjust the spacing of the first fin 250A and the second fin 250B relative to base 232 or riser 233 if the sensed temperature of the temperature sensor within chip 202 differs from the third predetermined temperature by a predetermined threshold amount.

Embodiments of the present invention may be a system, a method, and/or a computer program product. The computer program product may include a computer readable storage medium (or media) having computer readable program instructions thereon for causing a processor to carry out aspects of the present invention. The computer readable storage medium is a tangible device that can retain and store instructions for use by an instruction execution device. The computer readable storage medium may be, for example, but is not limited to, an electronic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate exemplary architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or surface of the carrier 208, regardless of the actual spatial orientation of the carrier 208. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

What is claimed is:

1. A method to fabricate an electronic device comprising:
    engaging a first heat sink fin with a first threaded knurl comprising a first thread of a first thread pitch;
    engaging a second heat sink fin with a second threaded knurl comprising a second thread of a second thread pitch;
    engaging the first heat sink fin and the second heat sink fin with a heat sink base to fix rotation of the first heat sink fin and the second heat sink fin relative to the heat sink base about an axis orthogonal to a major surface of the heat sink base; and
    connecting the first threaded knurl with the second threaded knurl to fix rotation of first threaded knurl with the second threaded knurl about the axis orthogonal to the major surface of the heat sink base.

2. The method of claim 1, further comprising:
    thermally connecting the heat sink base to a semiconductor chip.

3. The method of claim 1, further comprising:
    connecting a first temperature sensing device to the first heat sink fin, wherein the first temperature sensing device measures the first heat sink fin temperature; and
    connecting a second temperature sensing device to the second heat sink fin, wherein the second temperature sensing device measures the second heat sink fin temperature.

4. The method of claim 2, further comprising:
    connecting a temperature sensing device to the semiconductor chip, wherein the temperature sensing device measures the semiconductor chip temperature.

5. The method of claim 1, further comprising:
    connecting a motor to the first threaded knurl, wherein the motor rotates the first threaded knurl and the second threaded knurl about the axis orthogonal to the major surface of the heat sink base.

6. The method of claim 1, wherein the major surface of the heat sink base is parallel with a major surface of the first heat sink fin and parallel with a major surface of the second heat sink fin.

7. The method of claim 1, wherein spacing between the first heat sink fin and the heat sink base and spacing between the second heat sink fin and the heat sink base changes upon the rotation of the first threaded knurl and the second threaded knurl about the axis orthogonal to the major surface of the heat sink base.

8. The method of claim 1, wherein the first heat sink fin is engaged with the heat sink base such that the first heat sink fin is nearest the heat sink base.

9. The method of claim 8, wherein the first thread pitch is smaller than the second thread pitch.

10. A method to fabricate an electronic device comprising:
    engaging a first heat sink fin with a first threaded knurl comprising a first thread of a first thread pitch;
    engaging a second heat sink fin with a second threaded knurl comprising a second thread of a second thread pitch;
    engaging the first heat sink fin and the second heat sink fin with a heat sink riser to fix rotation of the first heat sink fin and the second heat sink fin relative to the heat sink riser about an axis orthogonal to a major surface of the heat sink riser; and
    connecting the first threaded knurl with the second threaded knurl to fix rotation of first threaded knurl with the second threaded knurl about the axis orthogonal to the major surface of the heat sink riser.

11. The method of claim 10, further comprising:
    connecting the heat sink riser to a heat sink base.

12. The method of claim 11, further comprising:
    thermally connecting the heat sink base to a semiconductor chip.

13. The method of claim 10, further comprising:
    connecting a first temperature sensing device to the first heat sink fin, wherein the first temperature sensing device measures the first heat sink fin temperature; and
    connecting a second temperature sensing device to the second heat sink fin, wherein the second temperature sensing device measures the second heat sink fin temperature.

14. The method of claim 12, further comprising:
    connecting a temperature sensing device to the semiconductor chip, wherein the temperature sensing device measures the semiconductor chip temperature.

15. The method of claim 10, further comprising:
    connecting a motor to the first threaded knurl, wherein the motor rotates the first threaded knurl and the second threaded knurl about the axis orthogonal to the major surface of the heat sink riser.

16. The method of claim 10, wherein the major surface of the heat sink riser is parallel with a major surface of the first heat sink fin and parallel with a major surface of the second heat sink fin.

17. The method of claim 12, wherein the major surface of the heat sink riser is orthogonal to a major surface of the semiconductor chip.

18. The method of claim 10, wherein spacing between the first heat sink fin and the heat sink riser and spacing between the second heat sink fin and the heat sink riser changes upon the rotation of the first threaded knurl and the second threaded knurl about the axis orthogonal to the major surface of the heat sink riser.

19. The method of claim 1, wherein the first heat sink fin is engaged with the heat sink riser such that the first heat sink fin is nearest the heat sink riser.

20. The method of claim 8, wherein the first thread pitch is smaller than the second thread pitch.

* * * * *